United States Patent [19]

Ely

[11] Patent Number: 4,719,134

[45] Date of Patent: Jan. 12, 1988

[54] SOLDERABLE CONTACT MATERIAL

[75] Inventor: Brian W. Ely, Braintree, England

[73] Assignee: The General Electric Company p.l.c., London, England

[21] Appl. No.: 914,544

[22] Filed: Oct. 1, 1986

Related U.S. Application Data

[63] Continuation of Ser. No. 755,420, Jul. 16, 1985, abandoned.

[30] Foreign Application Priority Data

Jul. 31, 1984 [GB] United Kingdom ............... 8419490

[51] Int. Cl.$^4$ .............................................. H05K 3/00
[52] U.S. Cl. .......................................... 428/1; 29/843; 228/179; 228/180.1; 228/180.2; 427/96; 427/99; 427/108; 427/109; 427/110; 428/209; 428/901
[58] Field of Search ............... 428/1, 901, 209; 427/108–110, 96, 99; 228/179, 180.1, 180.2; 29/843

[56] References Cited

U.S. PATENT DOCUMENTS

| | | | |
|---|---|---|---|
| 3,922,385 | 11/1975 | Konantz | 427/91 |
| 3,928,658 | 12/1975 | van Bortel | 428/1 |
| 4,229,631 | 10/1980 | Arakawa | 200/144 B |
| 4,409,079 | 10/1983 | Miyazaki | 427/34 |
| 4,436,559 | 3/1984 | Fujita | 427/431 |
| 4,540,970 | 9/1985 | Kasamatsu | 337/291 |

FOREIGN PATENT DOCUMENTS

| | | |
|---|---|---|
| 1579667 | 6/1980 | United Kingdom . |
| 2139248 | 4/1984 | United Kingdom . |
| 2131831 | 9/1984 | United Kingdom . |

*Primary Examiner*—John D. Smith
*Attorney, Agent, or Firm*—Spencer & Frank

[57] ABSTRACT

It is often required to solder an electrical connection to a component or a lead thereto via a contact pad. At present pads are commonly of materials that tend to oxidize during any subsequent heat processing of the device, and are then difficult to solder. It has now been discovered that certain alloys of copper containing manganese may be used to construct contact pads that are both solderable and remain so even when ovened in air at 200° C., and the invention provides a method of constructing solderable contact pads upon a chosen substrate, in which method there is formed on the relevant area of the substrate a layer of such a manganese/copper alloy.

20 Claims, No Drawings

SOLDERABLE CONTACT MATERIAL

This application is a continuation of application Ser. No. 06/755,420, filed July 16th, 1985 now abandoned.

BACKGROUND OF THE INVENTION

(1) Field of the Invention

This invention concerns solderable contact materials, and relates in particular to methods of providing these on substrates therefor.

(2) Description of the Prior Art

There are numerous occasions in the general electronics field where it is required to solder an electrical connection to a component or a lead thereto via a contact pad (an area of conductive material itself already connected to the component or lead). For example, semiconductor devices—including light—emitting diodes and hybrid assemblies—may be mounted on a non-conductive substrate and have thin conductive leads extending therefrom to relatively large pads which may in turn be connected, by wires soldered thereto, to the pins of a dual-in-line package of which the device and its substrate form a part. Again, the electrodes of a liquid crystal display unit may be connected via thin conductive leads to larger pads by which the unit may be solder-wire connected to the equipment driving the display. Yet again, the conductive tracks of a printed circuit board, to which tracks the components carried by the board are all connected, may be considered as a series of giant contact pads.

It is at present conventional to vacuum deposit contact pads into place in a preliminary stage of the device's manufacture. Unfortunately, making contacts in this way has presented problems, for vacuum-deposited contacts are commonly of materials that tend to oxidize during any subsequent heat processing of the device. Thus, one contact material combination used is a bi-layer of NICHROME (NICHROME is a Registered Trademark for various alloys of nickel and chromium; NICHROME IV is 80% Ni, 20% Cr, while NICHROME wire or ribbon is commonly either 75% Ni, 12% Fe, 11% Cr and 2% Mn, or 60% Ni, 24% Fe, 16% Cr), as a base adhesion layer, and then aluminum. Even at room temperature the aluminum forms a thin oxide layer, and can only be ultrasonically bonded to aluminum or gold wire; at elevated temperatures (i.e., 200° C.), the aluminum forms a thicker oxide layer which renders the pad useless. Another combination is a bi-layer of chromium or NICHROME and then gold, but this requires a reasonably thick layer of gold for it to be bondable or solderable, so a tri-layer combination of chromium or NICHROME followed by copper and then gold has been used and has been quite successful. However, the cost of gold has led to the investigation of other alloys and combinations with varied results.

In the Specification of our copending British Application for Letters Patent No: 83/12,213 (Publication No: 2,139,248) (I/6766/MB) it is disclosed that certain alloys of copper containing very small ($\simeq$0.5 wt%) quantities of aluminum may be used on top of a base adhesion layer of chromium or NICHROME to construct (by, for example, standard evaporation techniques) bi-layer contact pads—the layer of chromium or NICHROME, and then the layer of aluminum/copper alloy—that are both solderable and remain so even when ovened in air at 200° (and so do not oxidize under such conditions). The present invention concerns the very similar use of some different copper alloys, namely the use of alloys of copper and manganese.

BRIEF SUMMARY OF THE INVENTIVE CONCEPT

In one aspect, therefore, the invention provides a method of constructing solderable contact pads upon a chosen substrate, in which method there is formed on the relevant area of the substrate a layer of a copper/-manganese alloy consisting essentially of copper and manganese only, the thus-formed layer of alloy constituting the desired contact pad.

DETAILED DESCRIPTION OF THE INVENTIVE CONCEPT

The substrate upon which the contact pads are formed may be whatever is relevant to the device being fabricated. Accordingly, it may, for example, be a semiconductor material, a glass, a ceramic, or a synthetic resin (plastics). The invention is of particular value in the construction of liquid crystal displays, when the substrate is the glass of the liquid crystal cell.

Depending upon the particular technique employed, the layer may either be formed directly on the substrate surface, or it may be prepared upon a base adhesion layer that has previously been formed on the substrate surface (commonly by vacuum evaporation or sputtering techniques). Typical base adhesion layers are of chromium and of NICHROME (80 wt% nickel and 20 wt% chromium).

The precise method by which the desired alloy layer is formed on the substrate may be any convenient method for forming metal layers. The layer may, for example, be screen printed directly onto the substrate, using as "ink" a paste of the alloy (in powder form) together with a glassy binder and one or more liquid components that hold the paste together til it is subsequently "fired" to leave a glassy but conductive coating. Alternatively, the layer may be vacuum evaporated/deposited onto an adhesion layer on the substrate, or it may be sputtered on. Moreover, where the method is vaccum evaporation the source of manganese and copper either may be an alloy thereof or it may be separate billets of manganese and copper simultaneously evaporated and so positioned and dimensioned as to act like an alloy.

To form contact pads of any particular shape or size an evaporation or sputtering method can be utilized with a mask to prevent alloy being deposited on other areas. Alternatively, however, the pads may be shaped afterwards, by etching away unwanted material, using conventional photolithography resist and etching techniques.

The manganese/copper alloy layer is one that contains both copper and manganese. While there should be some significant amount of each—say, 0.5 wt% or more—there appears, apart from this, to be no restrictions on how much manganese may be alloyed with the copper (or copper alloyed with the manganese). For practical purposes an alloy layer which is overall an alloy of copper and from 10 to 90 wt% (based upon the total) manganese, seems quite satisfactory. Indeed, there seems to be very little different in the solderability and oxidation resistance of copper/manganese alloys regardless of the exact proportions of manganese and copper, and it is for mere convenience that roughly 50/50 wt alloys are preferred. Incidentally, the expression "overall an alloy of copper and . . . manganese" is used here to indicate a copper/manganese alloy the structure—the proportions of copper and manganese—of which need not be constant throughout the layer formed therefrom so long as taken as a whole the layer has the defined composition. The reason for this is to encompass both alloy layers formed by what are essentially distillation techniques (vacuum evaporation, for example) which naturally result in some preferential deposition of one or other component of the mixture depending upon their relative vapor pressures, so giving a layer that is not uniform throughout, and other techniques (for example, sputtering and screen printing) which do not involve any such preferential deposition, and so do give a uniform layer.

The screen printing technique appears to be of considerable promise. In it there is employed a paste of finely divided copper/manganese alloy suspended in a suitable mixture of metal oxides such that when fired the metal oxides fuse to form a glass which wets the substrate surface whilst the metal alloy particles sinter to produce a continuous conducting film. This technique is a particularly attractive one, and is further described as follows.

The mixture of metal oxides, known as the frit, might typically be 30 wt% lead oxide, 35 wt% boron oxide, 10 wt% silicon oxide and 25 wt% bismuth oxide, finely ground to a particle size of below 10 microns—preferably to 5 microns or less. This grinding is done in a suitable organic solvent/binder mixture, conveniently a combination of one or more alcohol or ester (for example, methyl, ethyl, butyl, propyl and higher alcohols, and the corresponding esters), pine oil, or terpineol.

To 100 parts by weight of solid in this mix is added 80 parts by weight of the chosen copper/manganese alloy—for example, 60% copper and 40% manganese (also known as a eutectic alloy)—which has also been reduced to a finely divided powder of 10 microns or less (and preferably 5 microns or less). The organic additives are then adjusted to bring the mix to a suitable viscosity (i.e. 100,000 to 200,000 cps) as normally required to produce the optimum fluid characteristics for a screen printing ink.

The formed ink may then be applied to the chosen substrate by means of a conventional screen printing machine whereby it is deposited in a suitable configuration—thus, to form pads along the edge of the substrate and/or interconnecting tracks across the surface of the substrate. A Dek 1202 type screen printer is most suitable for this.

Finally, the printed substrate is dried in an oven (at 150° C. for 15 mins in air) to remove all of the volatile solvents, and then fired (at from 400° C. to 1000° C., depending on the frit constituents, in an atmosphere which is either inert, such as nitrogen, or reducing, such as forming gas). The lowest possible firing temperature is preferred.

The invention extends, of course, to a substrate, or a device, whenever bearing contact pads formed by the method as described and claimed herein.

DETAILED DESCRIPTION

The following examples and test results are now given, though only by way of illustration, to show details of various embodiments of the invention.

EXAMPLE 1

Preliminary Preparation

A glass substrate, on which a pattern of conductive coating (indium/tin oxide) had already been formed, was cleaned and dried. It was then carefully aligned with an out-of-contact mask at a distance of 15 cm above an electron beam evaporation source in a vacuum evaporation system (Birvac Type TE12-RF).

Base adhesion layer

After pumping and ion bombardment cleaning of the substrate, and when the pressure was better than $1 \times 10^{-5}$ Torr, a layer of chromium 0.07 $\mu$m thick was evaporated on to the substrate to form a base adhesion layer.

Manganese/Copper Contact Pad Layer

On top of the base adhesion layer a manganese/copper layer was formed by completely evaporating an manganese/copper alloy pellet of some 0.1 gm containing 48.9 wt% manganese. This gave a layer about 0.3 $\mu$m thick as a manganese/copper alloy.

Testing (a) After removal from the vaccum system it was found that the layer had a yellowish copper color, and after firing in air for 1 hour at 200° C. no oxidation was evident.

(b) Pull tests were carried out on a Hunger Tensile Tester, Model TJ, fitted with Mechanical Force Gauge, Model D-50-T. A 22 swg tinned copper wire, soldered to the surface for a length of 2 mm using standard resincored electrical solder and pulled parallel to the surface, broke at a pull of 22 lbs, leaving the soldered joint intact.

EXAMPLES 2-7

The same layer preparation and testing was effected using the techniques of Example 1 applied to manganese/copper alloy pellets containing other quantities of magnesium. The results—including two "comparisons" outside the scope of the invention—are shown in the Table below.

TABLE

| Example No. | | Pellet Mix % | Analysis of Substrate Deposit | Solderability before ovening 1 hr/200° C. | Air Ovening Visible Oxidation | Solderability After Ovening 1 hr/200° C. | Pull Test after firing 22 SWG Cu Wire |
|---|---|---|---|---|---|---|---|
| Comparison only on Mn | Cr | 100 Mn | | Good | Gold | Poor Wetting | |
| 2 | Cu | 5.7 | | Good | Yellowish | Good | |
|   | Mn | 94.3 | | | | | |
| 3 | Cu | 20.54 | 17.40 | Good | Gold | Good | 21.7 lbs wire broke |
|   | Mn | 79.46 | 82.60 | | | | |
| 4 | Cu | 33.0 | | Good | Yellowish | Good | |
|   | Mn | 67.0 | | | | | |
| 1 | Cu | 48.89 | 45.0 | Good | Gold | Good | 22 lbs wire broke |
|   | Mn | 51.11 | 55.0 | | | | |

TABLE-continued

| Example No. | | Pellet Mix % | Analysis of Substrate Deposit | Solderability before ovening 1 hr/200° C. | Air Ovening Visible Oxidation | Solderability After Ovening 1 hr/200° C. | Pull Test after firing 22 SWG Cu Wire |
|---|---|---|---|---|---|---|---|
| 5 | Cu | 80.06 | 75.9 | Good | Gold | Good | 20.5 lbs wire broke |
|  | Mn | 19.94 | 24.1 |  |  |  |  |
|  | Cu | 89.43 |  | Good | Some Bluish Yellowish | Good |  |
|  | Mn | 10.57 |  |  |  |  |  |
| 7 | Cu | 98.35 |  | Good | Pale Yellow | Good |  |
|  | Mn | 1.65 |  |  |  |  |  |
| Comparison |  |  |  |  |  |  |  |
| Cu only on Cr | | 100 Cu |  | Good | Dark Oxide Color | Poor Wetting & Adhesion, trace peeling |  |

I claim:

1. A method of fabricating an electrical element comprising the steps of
   choosing a substrate selected from the group consisting of glass and a synthetic resin;
   bonding a contact pad to said substrate, said contact pad being formed by a layer which is overall an alloy consisting essentially of copper and manganese only; and
   soldering an electrical connector directly to the alloy forming said contact pad.

2. A method as claimed in claim 1 in which said substrate is glass, said glass being part of a liquid crystal cell.

3. A method as claimed in claim 1 which comprises the further step of forming a base adhesion layer on said substrate, said contact pad being then formed on said base adhesion layer.

4. A method as claimed in claim 3 wherein said base adhesion layer is selected from the group consisting of chromium and NICHROME IV.

5. A method as claimed in claim 1 wherein said contact pad is vacuum deposited onto said substrate.

6. A method as claimed in claim 5 wherein the source of manganese and copper in said contact pad is an alloy thereof having a manganese concentration of from 10 to 90 weight percent.

7. A method as claimed in claim 1 wherein said contact pad is screen printed onto said substrate.

8. A method as claimed in claim 7 wherein the source of manganese and copper in said contact pad is an alloy thereof having a maganese concentration of from 10 to 90 weight percent.

9. A method as claimed in claim 1 wherein the source of manganese and copper in said contact pad is an alloy thereof having a manganese concentration of more than about 20 weight percent.

10. A method as claimed in claim 1 wherein the step of bonding said contact pad to said substrate is performed by evaporating said alloy through a mask, whereby said contact pad is given a desired shape and said alloy is bonded only to selected areas of said subtrate.

11. A method as claimed in claim 1 wherein the alloy forming said contact pad contains approximately 50 weight percent manganese and 50 weight percent copper.

12. A method as claimed in claim 1 wherein the step of bonding a contact pad to a substrate is carried out at the lowest possible firing temperature.

13. A method as claimed in claim 1 wherein the step of bonding said contact pad to said substrate includes preparation of a paste of finely divided copper/manganese alloy and suspending it in a mixture of metal oxides, and then firing said suspension to (a) fuse said metal oxides to form a glass which wets the surface of said substrate and (b) sinter the particles of said alloy to produce a continuous conducting film, the temperature at which said firing is carried out depending upon the compositions of said metal oxides and being as low as possible.

14. A method as claimed in claim 13 wherein said metal oxides comprise a frit consisting essentially of lead oxide, boron oxide, silicon oxide and bismuth oxide, and wherein said firing is carried out at the lowest possible temperature.

15. An electrical element comprising
   a substrate selected from the group consisting of glass and a synthetic resin;
   a contact pad bonded to said substrate, said contact pad being formed by a layer which is overall an alloy consisting essentially of copper and manganese only; and
   an electrical connector soldered directly to the alloy forming said contact pad.

16. An electrical element as claimed in claim 15 wherein said substrate is glass, said glass being part of a liquid crystal cell.

17. An electrical element as claimed in claim 15 which further comprises a base adhesion layer interposed between said substrate and said contact pad.

18. An electrical element as claimed in claim 17 wherein said base adhesion layer is selected from the group consisting of chromium and NICHROME IV.

19. An electrical element as claimed in claim 15 wherein said alloy has a manganese concentration of from 10 to 90 weight percent.

20. An electrical element as claimed in claim 15 wherein said alloy contains approximately 50 weight percent manganese and 50 weight percent copper.

* * * * *